US007473106B2

(12) United States Patent
Liao et al.

(10) Patent No.: US 7,473,106 B2
(45) Date of Patent: Jan. 6, 2009

(54) IC SOCKET CONNECTOR CONFIGURED BY DISCRETE WAFERS ASSEMBLED TO A FRAME

(75) Inventors: Fang-Jun Liao, Tu-Cheng (TW); Shuo-Hsiu Hsu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/985,619

(22) Filed: Nov. 16, 2007

(65) Prior Publication Data

US 2008/0119085 A1    May 22, 2008

(51) Int. Cl.
*H01R 12/00* (2006.01)
*H05K 1/00* (2006.01)

(52) U.S. Cl. ........................................................ 439/71

(58) Field of Classification Search .................. 439/71, 439/70, 66
See application file for complete search history.

(56) References Cited

U.S. PATENT DOCUMENTS 6,506,073 B2 * 1/2003 McCutchan et al. ....... 439/540.1
6,679,707 B1 * 1/2004 Brodsky et al. ............... 439/71

* cited by examiner

*Primary Examiner*—Javaid Nasri
(74) *Attorney, Agent, or Firm*—Wei Te Chung

(57) ABSTRACT

An electrical connector of the present invention includes at least an wafer (10) mounting a plurality of conductive terminals (30) therein and a plurality of through holes (106) thereon and a frame member (20) receiving the at least a wafer (10). The frame member (20) defines a plurality of retaining portions (206) corresponding with the through holes (106). The retaining portions (206) are retained in the through holes (106) and each retaining portion (206) has a hollow structure (207).

2 Claims, 3 Drawing Sheets

IC SOCKET CONNECTOR CONFIGURED BY DISCRETE WAFERS ASSEMBLED TO A FRAME

BACKGROUND OF THE INVENTION

1. Field of the Invention

The present invention relates to a socket connector, and more particularly to a socket connector configured by discrete wafers assembled to a frame so as to effectively reduce warpage resulted from deformation of the plastic.

2. Description of the Prior Art

Sockets for mounting electronic devices such as integrated circuit chips on a printed circuit board are known. The socket may be mounted to the printed circuit board, while the integrated circuit chip is snap-fitted into the socket. One advantage of this arrangement is that, unlike integrated circuit chips that are soldered directly on the printed circuit board, an integrated circuit chip that is mounted in a socket can be easily disconnected from the printed circuit board for testing and replacement. However, the relatively dense layout and small size of electrical contacts on some integrated circuit chips necessitates precise alignment both between the socket and the printed circuit board, and between the integrated circuit chip and the socket.

U.S. Pat. No. 6,679,707 issued to Brodsky et al on Jan. 20, 2004 discloses a land grid array (LGA) connector that is formed from a plurality of sections. Specifically, each LGA section includes at least one set of fingers. Each set of fingers interconnects with a set of fingers of another section to form the LGA connector. By forming the LGA connector in this manner a maximum quantity of input/output (I/O) contacts can be provided.

The connector in this manner often comprises a plurality of wafers assembled on a frame member by a plurality of retaining members. The retaining members are often made of solid rivets, and the solid rivets need a large force to be pressed into through holes defined on the frame member and the friction between the rivet and edges of the hole is not enough. Hence, a new design which can overcome the problem is required.

SUMMARY OF THE INVENTION

Accordingly, an object of the present invention is to provide an IC socket connector with an improved retaining portion.

In order to achieve the object set forth, an IC socket connector comprises: at least a wafer mounting a plurality of conductive terminals therein and a plurality of through holes thereon; and a frame member receiving the at least one wafer and defining a plurality of retaining portions corresponding with the through holes; wherein the retaining portions are retained in the through holes and each retaining portion has a hole.

Other objects, advantages and novel features of the invention will become more apparent from the following detailed description of the present embodiment when taken in conjunction with the accompanying drawings.

DETAILED DESCRIPTION OF THE INVENTION

Figure 1:
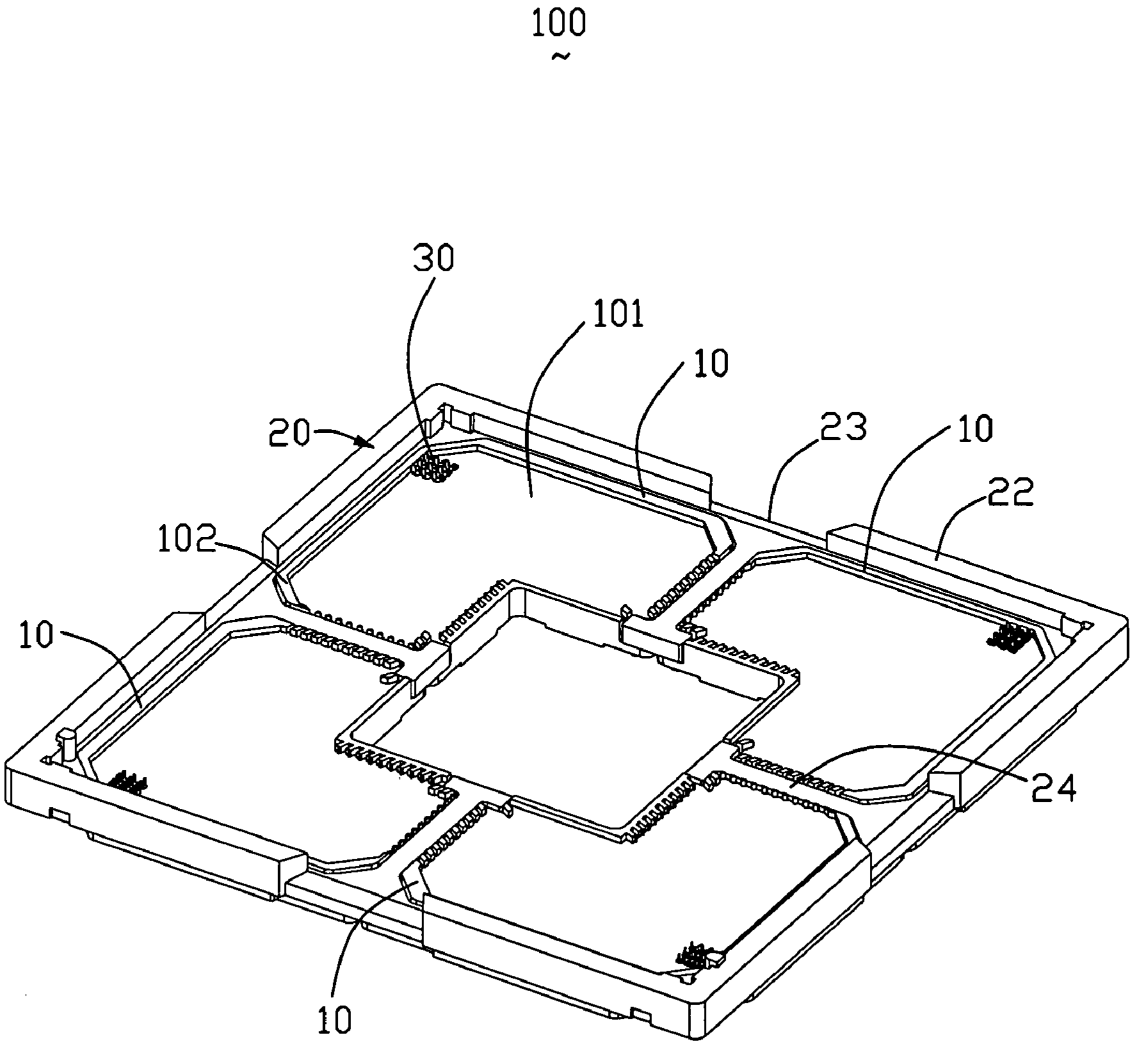
FIG. 1 is an assembled perspective view of an electrical connector in accordance with the present invention, showing an upper side of the electrical connector.

Reference will now be made to the drawing figures to describe a preferred embodiment of the present invention in detail.

Referring to FIG. 1, an electrical connector 100 in accordance with the present invention is adapted for electrically connecting IC packages (not shown) to a printed circuit board (not shown). The connector 100 comprises four L-shaped wafers 10 with a plurality of conductive terminals 30 retained therein and an insulating frame member 20 in which the wafers 10 embedded.

Figure 2:
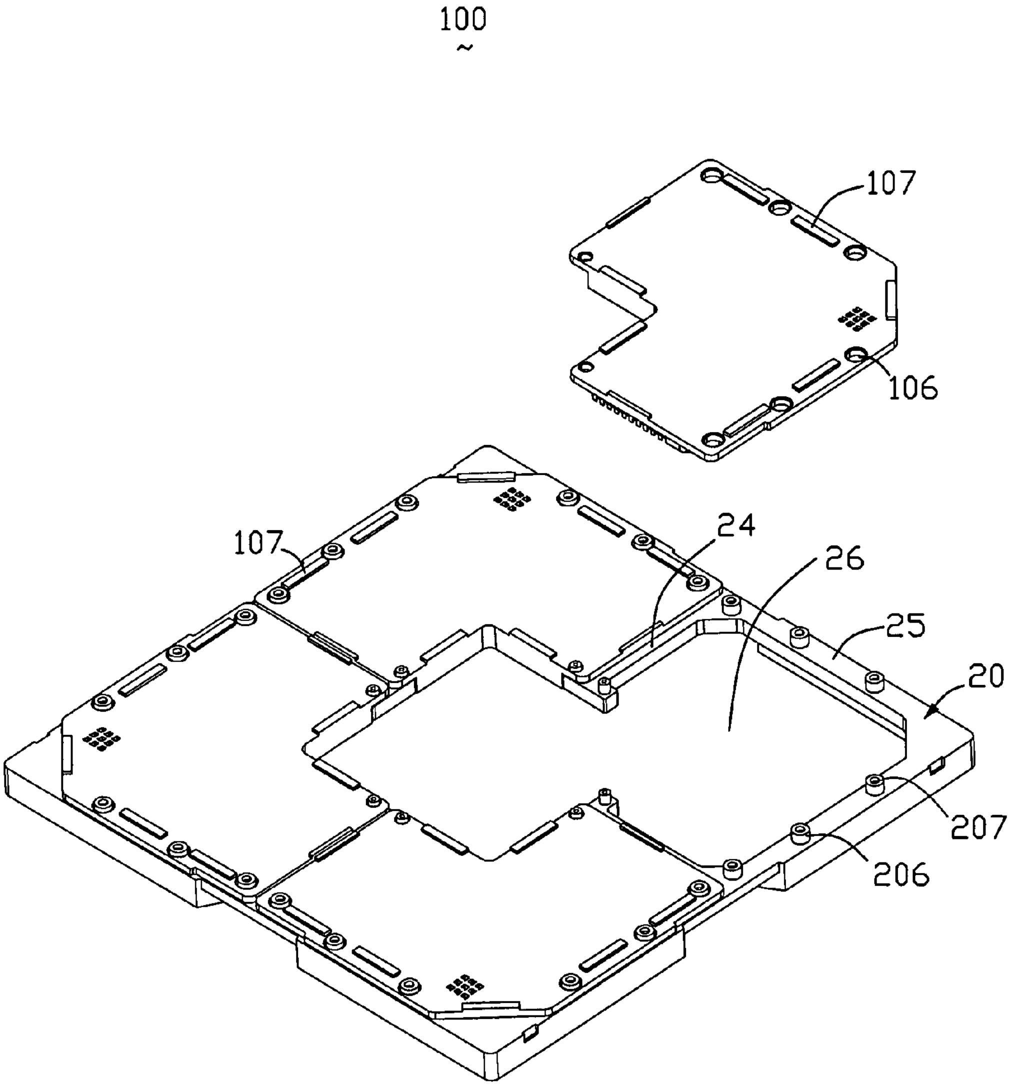
FIG. 2 is a partly-exploded perspective view of the electrical connector, showing a bottom side of the electrical connector.
Figure 3:
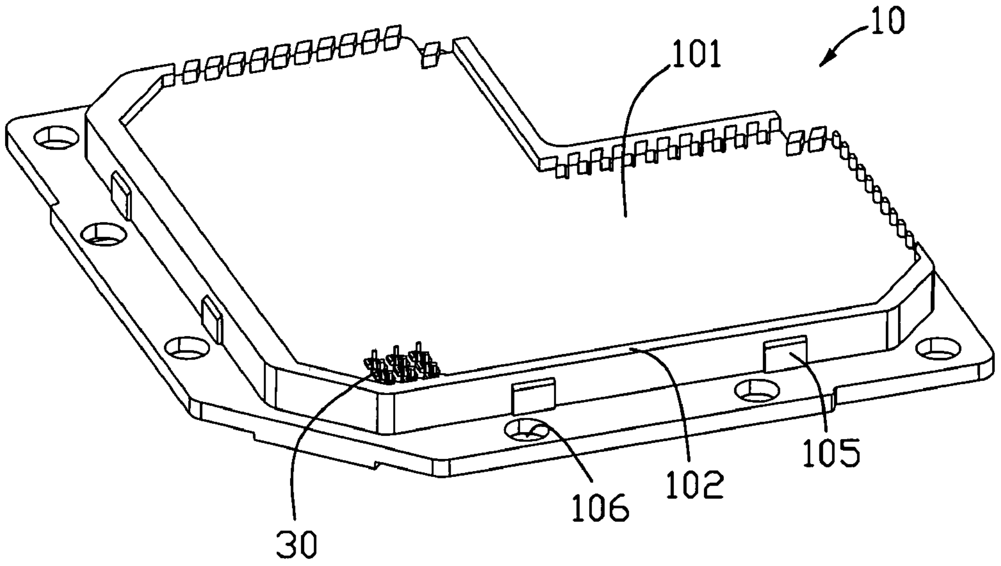
FIG. 3 is a perspective view of an insulating wafer of the electrical connector shown in FIG. 1.

Referring to FIG. 3, each wafer 10 is made of plastic material and have a plurality of continuous and discontinuous sidewalls 102 extending upwardly from edges thereof to define a receiving space 101 opened upwards for receiving an IC package such as a CPU. A plurality of terminal grooves (not figured) is located in the receiving space 101 and running through top and bottom of the housing to accommodate said terminals 30. A plurality of ribs 105 is defined on an outer side of the sidewalls 102 to interfere with the inner side of the frame member 20 when the wafer 10 is assembled on the frame member 20, which will be detailed described hereafter. A plurality of through holes 106 is defined on the outer flange of the base portion 101. A rib 107 is formed between every two adjacent through holes 106 on a bottom of the base portion, see FIG. 2.

Referring to FIGS. 1 and 2, the frame member 20 comprises a rectangular shaped body portion 25 and four sidewalls 22 extending upwardly from each side of the body portion 25. The sidewalls 22 are connected with each other and an opening 23 is defined in the middle of each sidewall 22 for providing an assemble space for an operator. Four T-shaped isolation portions 24 are symmetrical projecting into the center of the frame member 20 from four sides thereof, therefore the frame member 20 is divided into four equal receiving space 26 to receive the discrete wafers 10. The ends of the isolation portions 24 are apart from each other and form a rectangular space for assembling the CPU. A plurality of retaining portions such as rivets 206 insert-molded in the body portion is provided on the bottom of the frame member 20. The rivet 206 is in a column shape and each rivet has a hollow structure such as a hole 207 therein.

Referring to FIG. 2, four wafers 10 are put into the receiving space 26 from the bottom of the frame member 20. The rivets 206 on the frame member 20 are received in the through holes 106 on the wafer 10 by exterior pressing force. The ribs 105 on the outer side of the sidewalls 102 are interfering with the inner side of the frame member 20, as shown in FIG. 1. The hole 207 of the rivet 206 is helpful to increase the elasticity of the rivet. The rivets 206 are retained in the through holes 106 not only by friction between outside of the rivet 206 and inside of the through hole 106 but also by the elasticity force generated by the rivet 206, which will secure the rivet 206 in the through hole 106.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapted for connecting IC packages to a printed circuit board, comprising:

at least one wafer mounting a plurality of conductive terminals therein and a plurality of though holes thereon; and a frame member receiving the at least one wafer and defining a plurality of retaining portions insert-molded thereof corresponding with the through holes;

wherein the retaining portions are fully fitted in the through holes and each retaining portion has an inner hollow structure; wherein the frame member is configured by four side members interconnected to each other, and each of the side member further includes a sub-member extending substantially from a middle portion of each side member toward a geometric center of the frame member and dividing a general space within the side members into four discrete receiving spaces; wherein the at least one wafer has sidewalls perpendicularly protruding from edges thereof, the side walls interfere with side members of the frame member; wherein a plurality of ribs are formed on an outer periphery of said sidewalls to strength the interfering force between the sidewalls and side members of the frame member.

2. An electrical connector assembly comprising:

a frame extending in a horizontal plane and defining a peripheral section enclosing a receiving space;

a wafer dimensioned in compliance with said frame and stacked with the frame, said wafer essentially covering said receiving space in a direction perpendicular to said horizontal plane;

a plurality of terminals disposed in the wafer; and a rivet structure insert-molded in said peripheral section and extending along said direction and outwardly deformed to tightly combine said wafer and said frame together; wherein said wafer defines a through hole through which said rivet structure extends; wherein the rivet structure defines a recessed structure in an inner portion; wherein said rivet structure projects out of a bottom face of the frame; wherein the at least one wafer has sidewalls perpendicularly protruding from edges thereof, the side walls interfere with side members of the frame member; wherein a plurality of ribs are formed on an outer periphery of said sidewalls to strength the interfering force between the sidewalls and side members of the frame member.

* * * * *